(12) United States Patent
Fukushima et al.

(10) Patent No.: US 8,969,706 B2
(45) Date of Patent: *Mar. 3, 2015

(54) ADHESIVE TAPE AND SOLAR CELL MODULE USING THE SAME

(75) Inventors: Naoki Fukushima, Ibaraki (JP); Takehiro Shimizu, Tokyo (JP); Takahiro Fukutomi, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/222,236

(22) Filed: Aug. 31, 2011

(65) Prior Publication Data

US 2011/0308728 A1  Dec. 22, 2011

Related U.S. Application Data

(63) Continuation of application No. 12/298,633, filed as application No. PCT/JP2007/058818 on Apr. 24, 2007.

(30) Foreign Application Priority Data

Apr. 26, 2006  (JP) ................ P2006-121930

(51) Int. Cl.
*H01L 31/042* (2014.01)
*H01L 31/05* (2014.01)
(Continued)

(52) U.S. Cl.
CPC .......... *H01L 31/0512* (2013.01); *C09J 9/02* (2013.01); *C09J 163/00* (2013.01); *C09J 9/00* (2013.01); *C09J 11/04* (2013.01); *H01B 1/22* (2013.01);
(Continued)

(58) Field of Classification Search
CPC .......... H01L 31/05; H01L 31/022425; H01L 31/0512; C09J 163/00; C09J 9/00; C09J 9/02; C09J 11/04; H05K 3/323; Y02E 10/50; H01B 1/22
USPC ......................................... 136/250, 244, 256
See application file for complete search history.

(56) References Cited

U.S. PATENT DOCUMENTS 3,553,030 A   1/1971  Lebrun
4,098,945 A   7/1978  Oehmke
(Continued)

FOREIGN PATENT DOCUMENTS

CN   1180368 A   4/1998
CN   1226914 A   8/1999
(Continued)

OTHER PUBLICATIONS

Takahashi, JP2005-243935 A, Machine Translation, Sep. 2005.*
(Continued)

*Primary Examiner* — Devina Pillay
(74) *Attorney, Agent, or Firm* — Griffin & Szipl, P.C.

(57) ABSTRACT

The present invention provides an adhesive tape 10 for electrically connecting a plurality of solar battery cells, which adhesive tape has a metal foil 1 and an adhesive layer 2 composed of an adhesive provided on at least one surface of the metal foil 1, and a solar battery module using the adhesive tape. The adhesive tape of the present invention can suppress the decrease in the product yield and can improve the connection workability of solar battery cells.

13 Claims, 5 Drawing Sheets

(51) Int. Cl.
*C09J 9/02* (2006.01)
*C09J 163/00* (2006.01)
*C09J 9/00* (2006.01)
*C09J 11/04* (2006.01)
*H01B 1/22* (2006.01)
*H01L 31/0224* (2006.01)

(52) U.S. Cl.
CPC ......... *H01L 31/022425* (2013.01); *Y02E 10/50* (2013.01)
USPC ............ 136/244; 136/246; 156/325; 156/330

(56) References Cited

U.S. PATENT DOCUMENTS

| | | | |
|---|---|---|---|
| 4,356,505 | A | 10/1982 | Lovinger et al. |
| 4,568,592 | A | 2/1986 | Kawaguchi et al. |
| 4,569,879 | A | 2/1986 | Groves |
| 5,248,345 | A | 9/1993 | Sichanugrist |
| 5,391,235 | A | 2/1995 | Inoue |
| 6,344,156 | B1 * | 2/2002 | Yamada et al. ............... 252/512 |
| 6,459,032 | B1 | 10/2002 | Luch |
| 6,471,816 | B1 | 10/2002 | Shuto |
| 6,479,744 | B1 | 11/2002 | Tsuzuki et al. |
| 6,514,433 | B1 | 2/2003 | Takeichi et al. |
| 6,515,218 | B1 | 2/2003 | Shimizu et al. |
| 7,173,188 | B2 | 2/2007 | Endo |
| 7,208,105 | B2 | 4/2007 | Nomura et al. |
| 8,029,911 | B2 | 10/2011 | Nomura et al. |
| 2002/0014615 | A1 | 2/2002 | Yamada et al. |
| 2002/0016016 | A1 * | 2/2002 | Tsuzuki et al. ................. 438/57 |
| 2002/0127893 | A1 | 9/2002 | Brodsky |
| 2002/0139415 | A1 | 10/2002 | Shimizu et al. |
| 2003/0141014 | A1 | 7/2003 | Satoyuki et al. |
| 2003/0178138 | A1 | 9/2003 | Tsukagoshi et al. |
| 2003/0203668 | A1 | 10/2003 | Cobbley et al. |
| 2004/0105223 | A1 | 6/2004 | Okada et al. |
| 2004/0248336 | A1 | 12/2004 | Shimizu |
| 2005/0039943 | A1 | 2/2005 | Endo |
| 2005/0115602 | A1 * | 6/2005 | Senta et al. .................... 136/250 |
| 2007/0116961 | A1 * | 5/2007 | Connell et al. ................. 428/413 |
| 2008/0108250 | A1 | 5/2008 | Shimada |
| 2010/0294551 | A1 | 11/2010 | Nomura et al. |

FOREIGN PATENT DOCUMENTS

| | | |
|---|---|---|
| CN | 1294166 A | 5/2001 |
| CN | 1425192 A | 6/2003 |
| CN | 1498520 A | 5/2004 |
| CN | 1560168 A | 1/2005 |
| EP | 0 242 025 | 2/1987 |
| JP | 59-64685 A | 4/1984 |
| JP | 61-41535 A | 2/1986 |
| JP | 62-141083 A | 6/1987 |
| JP | 64-089209 | 4/1989 |
| JP | 1-113480 A | 5/1989 |
| JP | 03-188180 A | 8/1991 |
| JP | 04-152679 | 5/1992 |
| JP | 04-169080 A | 6/1992 |
| JP | 04-296723 A | 10/1992 |
| JP | 05-065348 A | 3/1993 |
| JP | 05-279644 | 10/1993 |
| JP | 05-320610 A | 12/1993 |
| JP | 06-196743 | 7/1994 |
| JP | 07-147424 | 6/1995 |
| JP | 08-315885 A | 11/1996 |
| JP | 08-330615 A | 12/1996 |
| JP | 08-332696 A | 12/1996 |
| JP | 09-312176 A | 12/1997 |
| JP | 10-093125 | 4/1998 |
| JP | 10-162646 | 6/1998 |
| JP | 10-162647 | 6/1998 |
| JP | 10-168412 | 6/1998 |
| JP | 10-326904 | 12/1998 |
| JP | 11-80632 | 3/1999 |
| JP | 11-080682 | 3/1999 |
| JP | 2000-286436 | 10/2000 |
| JP | 2000-323739 | 11/2000 |
| JP | 2001-297631 A1 | 10/2001 |
| JP | 2001-313313 | 11/2001 |
| JP | 2001-357897 | 12/2001 |
| JP | 2002-212525 A | 7/2002 |
| JP | 2002-226808 A | 8/2002 |
| JP | 2003-073649 A | 3/2003 |
| JP | 2003-151349 | 5/2003 |
| JP | 2003-253239 A | 9/2003 |
| JP | 2004/050779 A1 | 6/2004 |
| JP | 2004-164910 A | 6/2004 |
| JP | 2004-204256 | 7/2004 |
| JP | 2004-238738 A | 8/2004 |
| JP | 2005-50780 | 2/2005 |
| JP | 2005-101519 | 4/2005 |
| JP | 2005-194413 A | 7/2005 |
| JP | 2005-226048 | 8/2005 |
| JP | 2005-243935 | 9/2005 |
| JP | 2005-243935 A * | 9/2005 ............. H01L 31/04 |
| JP | 2005-252062 A | 9/2005 |
| JP | 2005-290241 A | 10/2005 |
| JP | 2005-320455 A | 11/2005 |
| JP | 2005325161 A | 11/2005 |
| JP | 2006-008978 A | 1/2006 |
| JP | 2006045459 A | 2/2006 |
| WO | 85/04980 | 11/1985 |
| WO | 00/46315 A1 | 8/2000 |
| WO | 2004/050779 A1 | 6/2004 |
| WO | 2005/086557 A1 | 9/2005 |

OTHER PUBLICATIONS

Connell, U.S. Appl. No. 60/739,569, filed Nov. 30, 2005.*
http:www.phenoxy.com/products/pkhh.html, Apr. 21, 2012.*
International Search Report issued in corresponding application No. PCT/JP2007/058818, completed May 10, 2007 and mailed May 22, 2007.
Search Report issued in the related European application No. 07742253.3, completed Dec. 9, 2009 and mailed Jan. 19, 2010.
Office Action issued in a counterpart Japanese application 2007-528906, mailed Oct. 19, 2010.
Notification of Information Provision issued in a counterpart Japanese application No. 2007-528906, dated Feb. 1, 2010.
Takahasi, JP 2005-243935, Machine Translation, Sep. 2005.
Office Action mailed in parent U.S. Appl. No. 12/298,633 on Oct. 18, 2011.
Notification of Information Provision issued in a related Japanese application 2010-283617 on Oct. 18, 2011.
Notification of Information Provision issued in a related Japanese application 2010-283616 on Oct. 18, 2011.
Office Action issued in counterpart Japanese application 2007-528609 on Aug. 30, 2011 (no translation available; submitted for certification purposes).
Office Action issued on Jun. 20, 2012 in a counterpart Chinese application 200780014488.1 (no translation available; submitted for certification).
Notification of Information Provision issued in counterpart Japanese application 2010-283616 on Apr. 17, 2012.
Office Action issued in counterpart Chinese application 201110077277.0 on May 10, 2012 (no translation available; submitted for certification).
Office Action issued in counterpart Japanese application 2010-283616 on Feb. 12, 2013 (no translation available; submitted for certification).
Office Action issued in counterpart Chinese application 201210484390.5 on Sep. 22, 2013 (no translation available; submitted for certification).
Office Action issued in related Japanese application 2010-283616 on Jul. 23, 2013 (no translation available; submitted for certification).
Office Action issued in related Japanese application 2010-283617 on Jul. 23, 2013 (no translation available; submitted for certification).
Taiwanese Office Action issued in related application 100130428 on Oct. 24, 2013 (no translation available; submitted for certification).

(56) References Cited

OTHER PUBLICATIONS

Japanese Office Action issued in related application 2010-283617 on Dec. 2, 2013 (no translation available; submitted for certification).
Office Action issued in co-pending related U.S. Appl. No. 13/667,869 on Nov. 13, 2013.
Office Action issued in related Japanese application 2013-085057 on Jan. 7, 2014 (no translation available; submitted for certification).
Office Action issued in related Japanese application 2012-093013 on Feb. 12, 2014 (no translation available; submitted for certification).
Office Action issued in related Japanese application 2010-283617 on Dec. 3, 2013 (previously submitted and considered, but identified as issued on Dec. 2).
Office Action issued in counterpart Chinese application 201110077263.9, on Jun. 5, 2014 (no translation available; submitted for certification).
Office Action issued in counterpart Japanese application P2013-085057, on Aug. 5, 2014 (no translation available; submitted for certification).
Office Action issued in co-pending related U.S. Appl. No. 13/687,869 on May 21, 2013.
Chinese Office Action issued in related application 2012/10484390.5 on Oct. 22, 2014 (no translation available).
Chinese Office Action issued in related application 2013/10201615.6 on Oct. 22, 2014 (no translation available).
Office Action issued in co-pending related U.S. Appl. No. 13/667,869 on Dec. 22, 2014.
Extended European Search report issued in counterpart application 13173002.0, completed Jan. 5, 2015 and mailed Jan. 13, 2015.

* cited by examiner

ADHESIVE TAPE AND SOLAR CELL MODULE USING THE SAME

This is a continuation application of U.S. patent application Ser. No. 12/298,633, which was filed on Feb. 9, 2009 as the National Phase Application in the United States of International Patent Application PCT/JP2007/058818 filed April 24, 2007, which claims priority on Japanese Patent Application No. P2006-121930 filed Apr. 26, 2006. The entire disclosures of the above patent applications are hereby incorporated by reference.

TECHNICAL FIELD

The present invention relates to an adhesive tape for electrically connecting a plurality of solar battery cells and a solar battery module using the same.

BACKGROUND ART

Solar battery modules are solar photovoltaic power generation apparatuses to directly convert light energy to an electric energy. The solar battery modules attract attention as a clean energy in resent years, and their market is anticipated to rapidly expand from now. Such solar battery modules generally have a structure in which a plurality of solar battery cells are electrically connected.

As methods of electrically connecting solar battery cells, methods using solders are conventionally known (for example, see Patent Documents 1 and 2). Solders are broadly used because they are excellent in connection reliability such as conductivity and fixing strength, and inexpensive and versatile.

On the other hand, as methods of electrically connecting solar battery cells without using solders, methods using a conductive adhesive are also disclosed (for example, see Patent Documents 3, 4, 5 and 6).

Patent Document 1: Japanese Patent Laid-Open No. 2004-204256
Patent Document 2: Japanese Patent Laid-Open No. 2005-050780
Patent Document 3: Japanese Patent Laid-Open No. 2000-286436
Patent Document 4: Japanese Patent Laid-Open No. 2001-357897
Patent Document 5: Japanese Patent Laid-Open No. 7-147424
Patent Document 6: Japanese Patent Laid-Open No. 2005-101519

DISCLOSURE OF THE INVENTION

Problems to be Solved by the Invention

However, in connection methods using solders, since a high temperature (the fusing temperature of solders is usually 230 to 260° C.) is involved on connection, volume shrinkage and the like are generated in adherends (solar battery cells), causing characteristic degradation of solar batteries in some cases. There is therefore a problem of the decreased product yield.

Particularly in solar battery modules, the price of solar battery cells accounts for nearly 40% of the price of a solar battery module and rapid expansion of the solar battery market is anticipated, so the thickness reduction of solar battery cells will inevitably be demanded in future. Advancement of the thickness reduction of solar battery cells causes warping and cracking in the solar battery cells due to a high temperature involved on connection, and also raises a problem of a remarkably decreased product yield.

Further, in connection methods using a solder, it is difficult to control the thickness of the connection interface with an adherend because of solder characteristics, and it is difficult to provide a sufficient dimensional precision on packaging. The case where a sufficient dimensional precision is not provided leads to a decrease in the product yield on the packaging process.

On the other hand, methods using a conductive adhesive are suitable for the electric connection of thickness-reduced solar battery cells because the connection can be performed at a lower temperature than methods using a solder. However, conventional methods using a conductive adhesive necessitate a process to transfer the conductive adhesive to an adherend, and have a problem of a low connection workability of solar battery cells.

Then, the present invention has been achieved in consideration of the above-mentioned situations, and has an object to provide an adhesive tape which can suppress the decrease in the product yield and can improve the connection workability of solar battery cells, and a solar battery module using the adhesive tape.

Means for Solving the Problems

The present invention provides an adhesive tape for electrically connecting a plurality of solar battery cells, which adhesive tape has a metal foil and an adhesive layer composed of an adhesive provided on at least one surface of the metal foil.

According to the adhesive tape of the present invention, since an adhesive layer is provided on at least one surface of a metal foil, when solar battery cells are connected, the work of transferring an adhesive layer on an insulating base material from the base material to each solar battery cell can be omitted. Further, the connection can be performed at a sufficiently lower temperature than in cases of connecting solar battery cells using a solder. Therefore, warping and cracking of solar battery cells on connection can be sufficiently prevented and the yield of solar battery modules can be sufficiently enhanced in its turn.

The adhesive preferably contains conductive particles. With this, a plurality of solar battery cells can easily be electrically connected.

The adhesive preferably contains further a thermosetting resin for improving the connection reliability after the connection.

The metal foil is preferably a copper foil or an aluminum foil because of its excellent conductivity.

In the adhesive tape of the present invention, the adhesive layers are preferably provided on both surfaces of a metal foil. With this, since solar battery cells can be connected to both surfaces of an adhesive tape, solar battery cells can easily be connected in either of series connection and parallel connection.

The present invention further provides a solar battery module which has a plurality of solar battery cells, which cells are electrically connected through a connection member, which member is formed using the above-mentioned adhesive tape. Since such a solar battery module uses the adhesive tape of the present invention, the product yield can be enhanced and the connection workability of solar battery cells can be improved. Therefore, the cost reduction on fabricating solar battery modules can be achieved.

Effect of the Invention

According to the present invention, there are provided an adhesive tape which can suppress the decrease in the product yield and can improve the connection workability of solar battery cells, and a solar battery module using the adhesive tape.

EXPLANATION OF SYMBOLS

Figure 1:
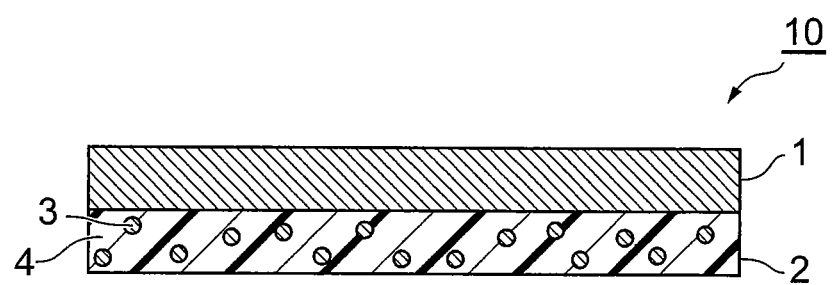
FIG. 1 is an illustrative sectional view showing an embodiment of an adhesive tape according to the present invention.

1: Metal foil, 2, 2a, 2b: adhesive layer, 3: conductive particle, 4: insulating adhesive composition, 5a, 5b: bus electrode, 6: power generating section, 7: forger electrode, 8: rear surface electrode, 10, 20: adhesive tape, 100: solar battery module, 101: solar battery cell, 102a, 102b: connection layer, 120: connection member.

BEST MODES FOR CARRYING OUT THE INVENTION

Hereinafter, preferable embodiments of the present invention will be described in detail by way of drawings, but the scope of the present invention is not limited to the following embodiments. In drawings, the same reference character is given to the same element and duplicated description will be omitted. The positional relationship with respect to top and bottom and left and right and the like is based on the positional relationship shown in drawings as long as not otherwise specified. Besides, the dimensional ratios of the drawings are not limited to those shown in the drawings.

FIG. 1 is an illustrative sectional view showing a first embodiment of an adhesive tape according to the present invention. The adhesive tape 10 shown in FIG. 1 has a structure having an adhesive layer 2 provided on one surface of a metal foil 1.

Figure 2:
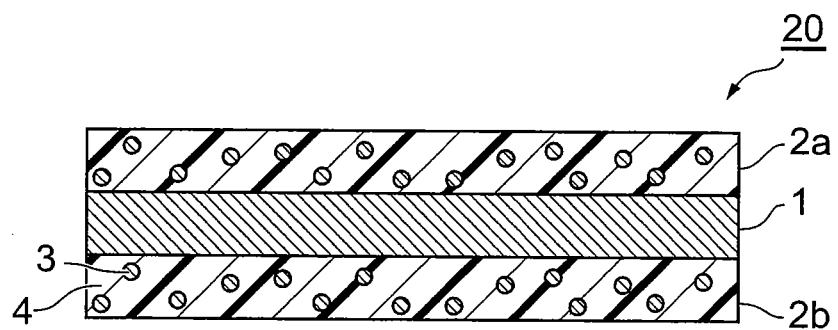
FIG. 2 is an illustrative sectional view showing another embodiment of an adhesive tape according to the present invention.

FIG. 2 is an illustrative sectional view showing a second embodiment of an adhesive tape according to the present invention. The adhesive tape 20 shown in FIG. 2 has a structure having adhesive layers 2a and 2b provided on both surfaces of a metal foil 1.

The adhesive layers 2, 2a and 2b are each composed of an adhesive containing a conductive particle 3 and an insulating adhesive composition 4. In the first and second embodiments, embodiments in which the adhesive layers 2, 2a and 2b contain a conductive particle 3 are shown, but the adhesive layers 2, 2a and 2b may not contain a conductive particle 3. That is, in the case where a metal foil 1 and an electrode of a solar battery cell described later can directly be contacted by pressing the metal foil 1 to the electrode of the solar battery cell though an adhesive layer, the adhesive layers 2, 2a and 2b may not contain a conductive particle. However, that the adhesive layers 2, 2a and 2b contain a conductive particle 3 allows for more stably electrically connecting solar battery cells.

The metal foil 1 includes, for example, a foil of copper, aluminum, iron, gold, silver, nickel, palladium, chromium and molybdenum or an alloy thereof. Above all, copper foil and aluminum foil are preferable because of their excellent conductivity. The thickness of such a metal foil 1 is preferably 10 to 200 μm in view of the connection reliability and the like.

The conductive particle 3 includes, for example, a gold particle, silver particle, copper particle, nickel particle, gold-plated nickel particle, gold/nickel-plated plastic particle, copper-plated particle and nickel-plated particle. These conductive particles preferably have a chestnut shape or a spherical shape in view of the embeddability of the conductive particle in the irregularity of an adherend surface on connection. That is, the chestnut-shaped or sphere-shaped conductive particle is preferable because it has a high embeddability in a complicate irregular shape of an adherend surface and a high followability to fluctuations such as vibration and expansion after connection.

Such a conductive particle has preferably an average particle size of 2 to 20 μm in view of securing the conductivity. The content of the conductive particle is preferably 0.1 to 20% by volume to the whole adhesive volume. With the content of the conductive particle of less than 0.1% by volume, the conductive particle is likely not to sufficiently exhibit an effect on the connection stability. By contrast, with the content of the conductive particle exceeding 20% by volume, the formability of the adhesive layer is likely to decrease.

The insulating adhesive composition 4 to be usable is a thermoplastic material or a material exhibiting curability to heat and light. The insulating adhesive composition 4 preferably contains a thermosetting resin in view of improving the connection reliability at a high temperature and high humidity after connection. The thermosetting resin includes, for example, epoxy resins, polyimide resins, unsaturated polyester resins, polyurethane resins, bismaleimide resins, triazine-bismaleimide resins and phenol resins. Above all, epoxy resins are preferable in view of improving heat resistance. The epoxy resin includes bisphenol epoxy resins derived from epichlorohydrin, and bisphenol A, bisphenol F, bisphenol AD, and/or bisphenol AF or the like; epoxy novolac resins derived from epichlorohydrin, and phenol novolacs and/or cresol novolacs; naphthalene epoxy resins having a skeleton containing a naphthalene ring; and various types of epoxy compounds having two or more glycidyl groups in one molecule, such as glycidylamines, glycidyl ethers, biphenyls and alicyclics. These are used singly or as a mixture of two or more.

The content of such a thermosetting resin is preferably 10 to 80% by mass, more preferably 15 to 70% by mass, to the total amount of the insulating adhesive composition 4. With the content of less than 10% by mass, the fluidity and workability of the adhesive is likely to decrease as compared with cases in the above-mentioned range. With the content exceeding 80% by mass, the adhesiveness of the adhesive tape is likely to decrease as compared with cases in the above-mentioned range.

The insulating adhesive composition 4 may further contain a curing agent for a thermosetting resin with the thermosetting resin.

A curing agent for a thermosetting resin indicates a curing agent to promote curing of the thermosetting resin when it is heated together with the thermosetting resin. Specific examples include imidazole curing agents, hydrazide curing agents, amine curing agents, phenol curing agents, acid anhydride curing agents, boron trifluoride-amine complexes, sulfonium salts, iodonium salts, polyamine salts, amine imides and dicyandiamide. When an epoxy resin is used as a thermosetting resin, among these suitably used are imidazole curing agents, hydrazide curing agents, boron trifluoride-amine complexes, sulfonium salts, amine imides, polyamine salts and dicyandiamide.

The content of such a curing agent for a thermosetting resin is preferably 2 to 10% by mass, more preferably 4 to 8% by mass, to the total amount of the insulating adhesive composition 4. With the content of less than 2% by mass, the adhesiveness of the adhesive tape is likely to decrease as compared with cases in the above-mentioned range. With the content exceeding 10% by mass, the stability when the adhesive tape is preserved is likely to decrease as compared with cases in the above-mentioned range.

The adhesive layers 2, 2a and 2b are preferably film-shaped in view of the layer thickness precision and the pressure distribution on pressure bonding. In this case, the insulating adhesive composition 4 constituting the adhesive layers 2, 2a and 2b further contains a film forming material other than the above-mentioned thermosetting resin and curing agent for the thermosetting resin.

The film forming material is preferably a thermoplastic polymer such as a phenoxy resin, a polyester resin and a polyamide resin, more preferably a phenoxy resin, in view of the better film formability. The weight-average molecular weight of these film-formable polymers is preferably 10,000 to 10,000,000 in view of the fluidity of the adhesive film. With the weight-average molecular weight of the film-formable polymer of less than 10,000, the formability of the adhesive layer 2 is likely to decrease as compared with cases in the above-mentioned range. With the weight-average molecular weight of the film-formable polymer exceeding 10,000,000, the stress relaxation effect and the workability on curing of the adhesive layer are likely to decrease as compared with cases in the above-mentioned range.

The content of such a film-formable polymer is preferably 2 to 80% by mass, more preferably 5 to 70% by mass, to the total amount of the insulating adhesive composition 4. With the content of the film-formable polymer of less than 2% by mass, the stress relaxation effect and the adhesiveness improvement effect on curing are likely to decrease and with the content exceeding 80% by mass, the fluidity and the workability of the adhesive layer are likely to decrease as compared with cases in the above-mentioned range.

The insulating adhesive composition 4, as required, may further contain additives such as a coupling agent, a dispersant and a chelate material.

A coupling agent is used for improving the adhesiveness and wettability with an adherend. Specific examples thereof include silane coupling agents and titanate coupling agents. A dispersant is used for improving the dispersibility of the conductive particle 3. Specific examples thereof include calcium phosphate and calcium carbonate. A chelate material is used for suppressing metal migration and the like of silver, copper and the like. Specific examples thereof include inorganic ion exchangers.

When these additives are used, the content is preferably 0.1 to 10% by mass, more preferably 0.2 to 8% by mass, to the total amount of the insulating adhesive composition 4. With the content of less than 0.1% by mass, an effect of containing the additive is small as compared with cases in above-mentioned range. With the content exceeding 10% by mass, the stability when the adhesive tape is preserved is likely to decrease as compared with cases in the above-mentioned range.

The insulating adhesive composition 4 may contain a thermoplastic resin, a radically polymerizable compound and a radical polymerization initiator.

The thermoplastic resin to be usable is polyamides, phenoxy resins, poly(meth)acrylates, polyimides, polyurethanes, polyesters and polyvinylbutyrals. These resins may be used, as required, singly or as a mixture of two or more. The common weight-average molecular weight of these thermoplastic resins is 5,000 to 150,000.

The radically polymerizable compound to be usable is not especially limited, and includes well-known compounds as long as they are compounds having an olefin in their molecule such as a (meth)acryl group, a (meth)acryloyl group and a vinyl group. Above all, radically polymerizable compounds having a (meth)acryloyl group are preferable.

Specific examples of radically polymerizable compounds include oligomers such as epoxy(meth)acrylate oligomers, urethane (meth)acrylate oligomers, polyether (meth)acrylate oligomers and polyester (meth)acrylate oligomers, and polyfunctional (meth)acrylate compounds such as trimethylolpropane tri(meth)acrylate, polyethylene glycol di(meth)acrylates, polyalkylene glycol di(meth)acrylates, dicyclopentenyl (meth)acrylate, dicyclopentenyloxyethyl (meth)acrylate, neopentyl glycol di(meth)acrylate, dipentaerythritol hexa(meth)acrylate, isocyanuric acid-modified bifunctional (meth)acrylate, isocyanuric acid-modified trifunctional (meth)acrylate, 2,2'-di(meth)acryloyloxydiethyl phosphate and 2-(meth)acryloyloxyethyl acid phosphate. These compounds may be used, as required, singly or as a mixture of two or more.

The radically polymerizable initiators to be usable include conventionally well-known compounds such as peroxides and azo compounds, and specifically include cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxyneodecanoate, t-butyl peroxypivalate, 1,1,3,3-tetramethylbutyl peroxy-2-ethylhexanoate, 2,5-dimethyl-2,5-di(2-ethylhexanoylperoxy)hexane, t-hexyl peroxy-2-ethylhexanoate, t-butyl peroxy-2-ethylhexanoate, t-butyl peroxyneoheptanoate, t-amyl peroxy-2-ethylhexanoate, di-t-butyl peroxyhexahydroterephthalate, t-amyl peroxy-3,5,5-trimethylhexanoate, 3-hydroxy-1,1-dimethylbutyl peroxyneodecanoate, 1,1,3,3-tetramethylbutyl peroxy-2-ethylhexanoate, t-amyl peroxyneodecanoate, t-amyl peroxy-2-ethylhexanoate, 2,2'-azobis-2,4-dimethylvaleronitrile, 1,1'-azobis(1-acetoxy-1-phenylethane), 2,2'-azobisisobutyronitrile, 2,2'-azobis(2-methylbutyronitrile), dimethyl-2,2'-azobisisobutyronitrile, 4,4'-azobis(4-cyanovaleric acid), 1,1'-azobis(1-cyclohexanecarbonitrile), t-hexyl peroxyisopropylmonocarbonate, t-butyl peroxymaleic acid, t-butyl peroxy-3,5,5-trimethylhexanoate, t-butyl peroxylaurate, 2,5-dimethyl-2,5-di(3-methylbenzoylperoxy)hexane, t-butyl peroxy-2-ethylhexylmonocarbonate, t-hexyl peroxybenzoate, 2,5-dimethyl-2,5-di(benzoylperoxy)hexane, t-butyl peroxybenzoate, dibutyl peroxytrimethyladipate, t-amyl peroxy-n-octoate, t-amyl peroxyisononanoate and t-amyl peroxybenzoate. These compounds may be used singly or as a mixture of two or more.

The insulating adhesive composition 4 containing a thermoplastic resin, a radically polymerizable compound and a radical polymerization initiator may further contain additives, as required.

The thickness of the above-mentioned adhesive layers 2, 2a and 2b is preferably 5 to 50 μm in consideration of the adhesiveness and the conductivity. Further, the thickness thereof 2, 2a and 2b is more preferably 8 to 40 μm in consideration of the connection reliability. The thickness thereof 2, 2a and 2b can be controlled by adjustment of the amount of involatile components in an adhesive and adjustment of the gap of an applicator or a lip coater.

According to the above-mentioned adhesive tape, decrease in product yield can be suppressed and connection workability of solar battery cells can be improved.

Such an adhesive tape can be fabricated by a conventional well-known method, for example, the following method.

An adhesive composition containing constituents of the above-mentioned insulating adhesive composition 4 is dissolved or dispersed in an organic solvent to liquefy the composition, to prepare a coating liquid. The coating liquid is applied on one surface or both surfaces of a metal foil, and thereafter, the solvent is removed to form an adhesive layer(s). At this time, if the constituents of the insulating adhesive composition 4 include a thermosetting resin and a curing agent for the thermosetting resin, the coating liquid is dried at a temperature of less than the activity temperature of the curing agent. The metal foil having the adhesive layer(s) formed on one surface or both surfaces thereof in such a way is slit into an appropriate width to obtain the above-mentioned adhesive tape.

The organic solvent usable at this time includes, for example, ester solvents such as ethyl acetate. The coating liquid can be applied using a coating device such as a roll coater, a slit die coater, a dip coater, a spin coater, an applicator or a lip coater. In the case of fabricating an adhesive tape having adhesive layers formed on both surfaces of a metal foil, an adhesive layer is formed on one surface of the metal foil, and thereafter, an adhesive layer may be formed on the other surface thereof; or a coating liquid may be applied on both surfaces of a metal foil using a dip coater or the like, and thereafter, is dried.

The adhesive tape of the present invention can be suitably used for connection of solar battery cells. In solar battery modules, generally, a plurality of solar battery cells equipped with surface electrodes are in series and/or parallelly connected. The connected solar battery cells are interposed by tempered glass or the like for environment resistance and a gap between the solar battery cell and the tempered glass is filled with a transparent resin. The adhesive tape of the present invention is especially suitably used for applications to connect a plurality of solar battery cells in series and/or parallelly.

The solar battery module of the present invention has a plurality of solar battery cells, which are electrically connected using the above-mentioned adhesive tape.

Figure 3:
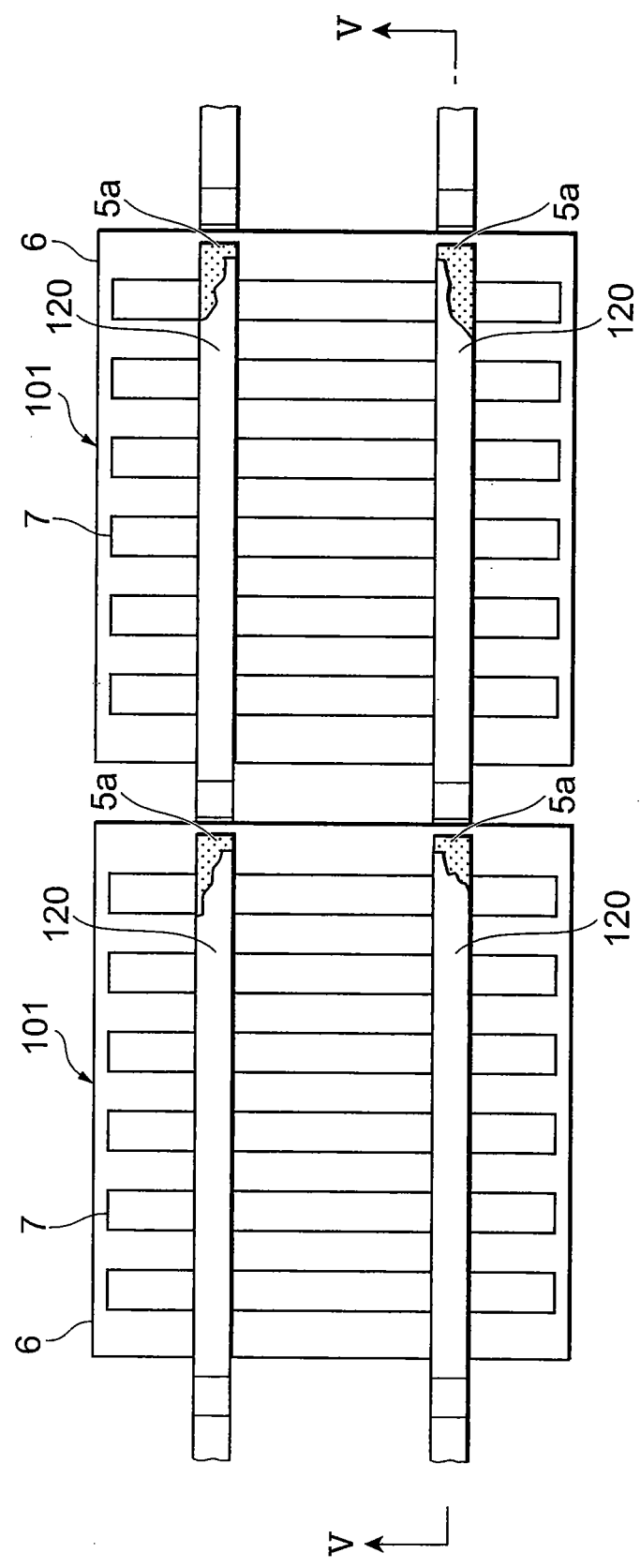
FIG. 3 is a partial plan view showing an embodiment of the solar battery module according to the present invention.
Figure 4:
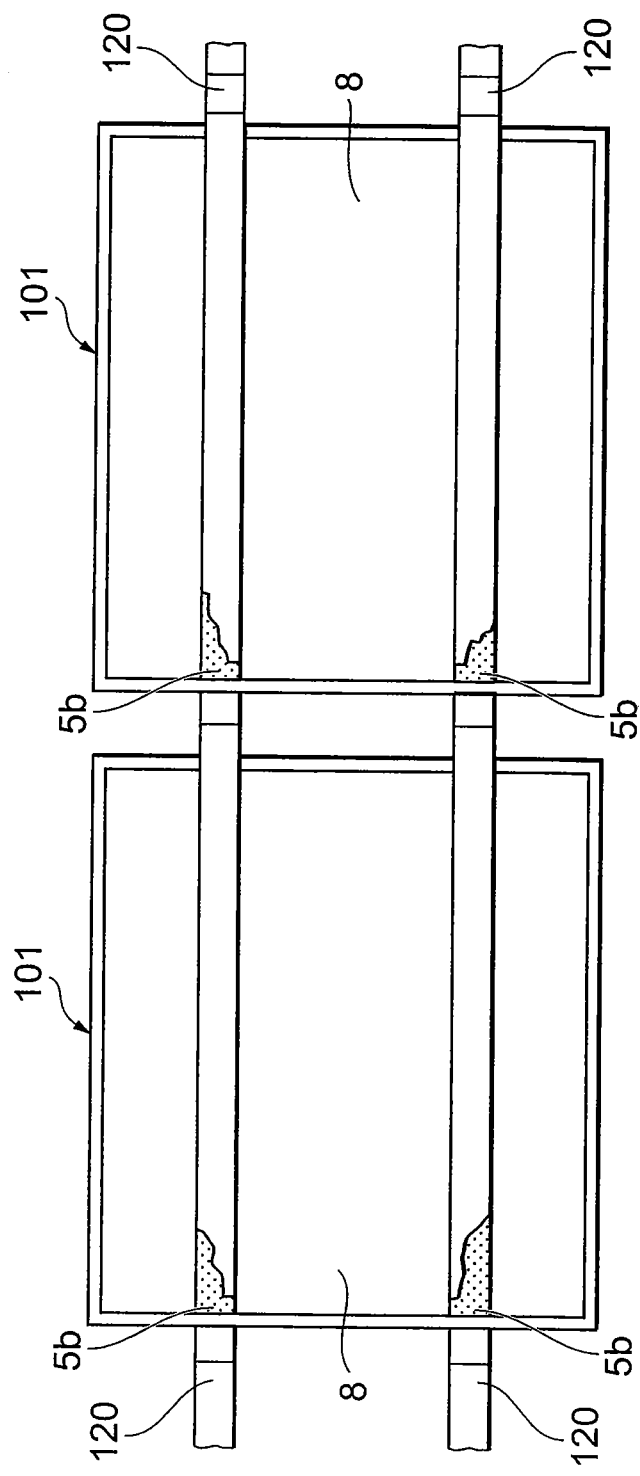
FIG. 4 is a bottom view of the solar battery module in FIG. 3.
Figure 5:
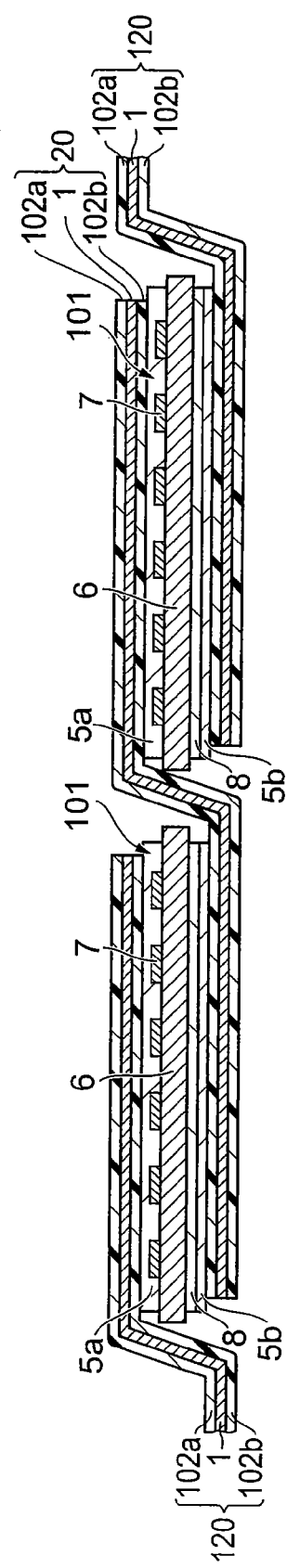
FIG. 5 is a sectional view taken on line V-V of FIG. 3.

Here, FIGS. 3, 4 and 5 are diagrams showing principal parts of a solar battery module according to an embodiment of the present invention, and show the structural outlines in which a plurality of solar battery cells are connected to one another. FIG. 3 is a partially broken plan view of the solar battery module according to the embodiment; FIG. 4 is a partially broken bottom view of the solar battery module in FIG. 3; and FIG. 5 is a sectional view taken on line V-V in FIG. 3. In FIG. 3 and FIG. 4, a connection member 120 described later is partially broken.

As shown in FIGS. 3, 4 and 5, the solar battery module 100 according to the embodiment has a plurality of solar battery cells 101. Each solar battery cell 101 has a power generating section 6. The power generating section 6 generates an electromotive force by solar light, and for example, is formed using a semiconductor wafer. On the front surface of the power generating section 6, a plurality of finger electrodes 7 (in FIGS. 3 to 5, six finger electrodes) are parallelly provided. On the finger electrodes 7, a plurality of bus electrodes 5a (in FIGS. 3 to 5, two bus electrodes) are provided so as to intersect the finger electrodes 7. Here, the finger electrodes 7 and the bus electrodes 5a are contacted.

On the other hand, on the rear surface of the power generating section 6, a rear surface electrode 8 is provided, on which 8 a plurality of bus electrodes 5b (in FIGS. 3 to 5, two bus electrodes) are provided. Then, the rear surface electrode 8 and the bus electrodes 5b are contacted.

Then, two solar battery cells 101 are connected through a connection member 120. Specifically, one end of the connection member 120 is connected to the bus electrodes 5a of one solar battery cell 101; and the other end of the connection member 120 is connected to the bus electrodes 5b of the other solar battery cell 101. That is, the solar battery cells 101 are connected in series. The connection member 120 is constituted of a metal foil 1 and connection layers 102a, 102b provided on both surfaces thereof, respectively. The layer contacting with the bus electrodes 5b is the connection layer 102a; and the layer contacting with the bus electrodes 5a is the connection layer 102b.

Here, the connection member 120 is formed using an adhesive tape 20. The connection layers 102a, 102b correspond to the adhesive layers 2a, 2b in the adhesive tape 20, respectively. At this time, if constituents of the insulating adhesive composition 4 include a thermosetting resin and a curing agent for the thermosetting resin, portions of the connection layers 102a, 102b corresponding to at least the bus electrodes 5a, 5b have been subjected to a curing process by a method described later or the like. Therefore, portions of the connection layers 102a, 102b corresponding to at least the bus electrodes 5a, 5b are each constituted of a conductive particle 3 and a cured body of the insulating adhesive composition 4.

Then, in the solar battery module 100, the solar battery cells 101 connected through the above-mentioned connection member 120 are interposed by tempered glass (not shown in figure) or the like and a gap between the solar battery cells 101 and the tempered glass is filled with a transparent resin (not shown in figure).

A material for the semiconductor wafer includes, for example, a semiconductor of a single crystal, polycrystal and non-crystal of silicon.

Materials for the finger electrodes 7, the bus electrodes 5a and 5b, and the rear surface electrode 8 include common well-known materials having conductivity, for example, a glass paste containing silver, a silver paste, gold paste, carbon paste, nickel paste and aluminum paste, in which various types of conductive particles are dispersed in an adhesive resin, and ITO formed by baking or deposition. Above all, an electrode composed of a glass paste containing silver is suitably used in view of the heat resistance, conductivity, stability and costs. The finger electrodes 7, the bus electrodes 5a and 5b, and the rear surface electrode 8 can be formed, for example, by screen printing.

If constituents of the insulating adhesive composition 4 include a thermosetting resin and a curing agent for the thermosetting resin, the above-mentioned curing process of the adhesive tape 20 can be performed by heat pressing, for example, at 140 to 200° C. and 0.5 to 4 MPa for 5 to 20 sec. If constituents of the insulating adhesive composition 4 include a thermoplastic resin, a radically polymerizable compound and a radical polymerization initiator, the above-mentioned curing process of the adhesive tape 20 can be performed by heat pressing, for example, at 140 to 200° C. and 0.1 to 10 MPa for 0.5 to 120 sec. This curing process can pressure-bond the adhesive tape 20 to the bus electrodes 5a and 5b; and portions of the adhesive layers 2a and 2b in the adhesive tape 20 corresponding to at least the bus electrodes 5a and 5b are cured and the adhesive tape 20 becomes the connection member 120.

The solar battery module 100 having such a constitution allows for an enhanced product yield and an improved connection workability of solar battery cells because the above-mentioned tape is used. Thereby, the cost when a solar battery module is fabricated can be reduced.

EXAMPLES

Then, the present invention will be described in detail by way of Examples, but the scope of the present invention is not limited thereto.

Example 1

(1) Fabrication of an Adhesive Tap 50 g of a phenoxy resin (high molecular epoxy resin) (made by Union Carbide Chemical & Plastics Technology Corp., trade name: PKHC), 20 g of an epoxy resin (made by Japan Epoxy Resins Co., Ltd., trade name: YL-980) and 5 g of imidazole were added to ethyl acetate to prepare a 30 mass % ethyl acetate solution; and chestnut-shaped Ni particles of 2.5 µm in average particle size of 5% by volume to the total volume of the solid components were added to the solution. The obtained mixed solution was applied on one surface of a copper foil of 75 µm in thickness using a roll coater. The applied solution was dried at 110° C. for 5 min to obtain a metal foil having an adhesive layer of 30 µm in thickness formed on the one surface. The resultant metal foil was slit into a width of 2.0 mm to obtain an adhesive tape. Here, the thickness of the adhesive layer was measured using a micrometer (made by Mitutoyo Corp., ID-C112).

(2) Connection of Solar Battery Cells Using the Adhesive Tape

The adhesive tape was aligned in the width direction of the electrode wiring (material: silver glass paste, 2 mm×15 cm, Rz=10 Ry=14 µm) formed on a solar battery cell (thickness: 150 µm, 15 cm×15 cm), and heat pressed at 170° C. and 2 MPa for 20 sec using a pressure bonding tool (tool name: AC-S300, made by Nikka Equipment & Engineering Co., Ltd.) to obtain a solar battery cell with an adhesive tape of Example 1.

Example 2

A solar battery cell with an adhesive tape of Example 2 was obtained as in Example 1, except for the thickness of the adhesive layer of 40 µm.

Example 3

A solar battery cell with an adhesive tape of Example 3 was obtained as in Example 1, except for using gold-plated Ni particles of 5 µm in average particle size in place of the chestnut-shaped Ni particles of 2.5 µm in average particle size.

Example 4

A solar battery cell with an adhesive tape of Example 4 was obtained as in Example 1, except for using gold/Ni-plated plastic particles (styrene-butadiene copolymer) of 10 µm in average particle size of 0.5% by volume to the total volume of the solid components in place of the chestnut-shaped Ni particles of 2.5 µm in average particle size.

Example 5

A solar battery cell with an adhesive tape of Example 5 was obtained as in Example 1, except for using an aluminum foil in place of the copper foil.

Example 6

A solar battery cell with an adhesive tape of Example 6 was obtained as in Example 1, except for using a copper foil of 175 µm in thickness in place of the copper foil of 75 µm in thickness.

Example 7

A solar battery cell with an adhesive tape of Example 7 was obtained as in Example 1, except for no addition of the Ni particles.

Comparative Example 1

A solar battery cell with an adhesive tape of Comparative Example 1 was obtained by using a TAB wiring in place of an adhesive tape and connecting the Tab wiring and the electrode wiring using a solder.

(Evaluation of Solar Batteries)

The solar battery cells with an adhesive tape obtained in Examples 1 to 7 and Comparative Example 1 were measured for the F.F. (curve factors) of solar batteries (initial values). Values of the F.F. after exposure of cells to 85° C. and 85% RH for 1,500 hours were also measured (final values). The IV curves were measured using a solar simulator made by Wacom Electric Co., Ltd. (WXS-155S-10, AM1.5G) and a value obtained by subtracting a final value from an initial value was defined as a Delta (F.F.). Here, if the Delta (F.F.) is not less than 0.2, the connection reliability is not sufficient.

Further, the cell yield, the adhesive layer formability and the adhesive tape formability were also evaluated. The cell yield indicates a proportion (%) obtained by excepting cases exhibiting cracks and exfoliations in 10 sheets of the solar battery cells as a result of observing cell situations after the adhesive tape was pressure bonded. The adhesive layer formability was evaluated as A when there was observed no fault of not less than φ50 µm; and it was evaluated as B when there were observed faults of not less than φ50 µm. The adhesive tape formability was evaluated as A when there was observed no floating and exfoliation of the adhesive layer on the metal foil; and it was evaluated as B when there was floating and exfoliation of the adhesive layer on the metal foil. Constitutions of materials of the adhesive tapes in Examples 1 to 7 above are shown in Table 1; and the evaluation results about Examples 1 to 7 and Comparative Example 1 are shown in Table 2.

TABLE 1

|  |  | Example 1 | Example 2 | Example 3 | Example 4 | Example 5 | Example 6 | Example 7 |
|---|---|---|---|---|---|---|---|---|
| Insulating adhesive | Phenoxy resin (g) | 50 | 50 | 50 | 50 | 50 | 50 | 50 |
|  | Epoxy resin (g) | 20 | 20 | 20 | 20 | 20 | 20 | 20 |
|  | Imidazole (g) | 5 | 5 | 5 | 5 | 5 | 5 | 5 |
|  | Thickness (µm) | 30 | 40 | 30 | 30 | 30 | 30 | 30 |

TABLE 1-continued

|  |  | Example 1 | Example 2 | Example 3 | Example 4 | Example 5 | Example 6 | Example 7 |
|---|---|---|---|---|---|---|---|---|
| Conductive particle | Kind | Chestnut-shaped Ni particle | Chestnut-shaped Ni particle | Gold-plated Ni particle | Gold/Ni-plated plastic particle | Chestnut-shaped Ni particle | Chestnut-shaped Ni particle | None |
|  | Average particle size (μm) | 2.5 | 2.5 | 5 | 10 | 2.5 | 2.5 | — |
|  | Content (% by volume) | 5 | 5 | 5 | 0.5 | 5 | 5 | 0 |
| Metal foil | Kind | Copper foil | Copper foil | Copper foil | Copper foil | Aluminum foil | Copper foil | Copper foil |
|  | Thickness (μm) | 75 | 75 | 75 | 75 | 75 | 175 | 75 |

TABLE 2

|  | Example 1 | Example 2 | Example 3 | Example 4 | Example 5 | Example 6 | Example 7 | Comparative Example 1 |
|---|---|---|---|---|---|---|---|---|
| Delta (F. F.) | 0.03 | 0.03 | 0.02 | 0.04 | 0.04 | 0.02 | 0.05 | 0.03 |
| Cell yield (%) | 100 | 100 | 100 | 100 | 100 | 100 | 100 | 60 |
| Adhesive layer formability | A | A | A | A | A | A | A | — |
| Tape formability | A | A | A | A | A | A | A | — |

The invention claimed is:

1. A process for producing a solar battery module comprising a plurality of solar battery cells electrically connected through a metal foil, comprising the steps of:
   (a) providing a plurality of solar battery cells; and
   (b) electrically connecting each solar battery cell to a metal foil by using an adhesive,
   wherein the adhesive comprises a conductive particle and an insulating adhesive composition,
   wherein a content of the conductive particle is 0.1 to 20% by volume to a whole adhesive volume,
   wherein the insulating adhesive composition further comprises a thermosetting resin, a curing agent for the thermosetting resin, and a film forming material,
   wherein the thermosetting resin is an epoxy resin,
   wherein a content of the thermosetting resin is 10 to 80% by mass to a total amount of the insulating adhesive composition,
   wherein a content of the curing agent is 2 to 10% by mass to the total amount of the insulating adhesive composition,
   wherein the film forming material is a phenoxy resin,
   wherein a weight-average molecular weight of the phenoxy resin is 10000 to 10000000, and
   wherein a content of the film forming material is approximately 67% to 80% by mass to the total amount of the insulating adhesive composition, wherein approximately is within the margins of error that are inherent in measuring the mass.

2. The process according to claim 1, wherein the adhesive is provided on a surface of the metal foil as an adhesive layer or the adhesive is provided on both surfaces of the metal foil as adhesive layers.

3. The process according to claim 1, wherein the conductive particle has an average particle size of 2 to 20 μm.

4. The process according to claim 1, wherein the conductive particle has a chestnut shape or a spherical shape.

5. The process according to claim 1, wherein the metal foil is a copper foil or an aluminum foil.

6. The method according to claim 1, wherein the insulating adhesive composition further includes a coupling agent, a dispersant and a chelate material.

7. The method according to claim 6, wherein the chelate material is an inorganic ion exchanger.

8. The method according to claim 6, wherein the coupling agent, dispersant and chelate material are 0.2 to 8% by mass of the total amount of the insulating adhesive composition.

9. A method for producing a solar battery module comprising a plurality of solar battery cells, the method comprising the steps:
   (a) providing a plurality of solar battery cells; and
   (b) connecting the plurality of solar battery cells electrically using adhesive tapes, wherein each adhesive tape comprises
      (i) a metal foil, wherein each metal foil has two surfaces; and
      (ii) at least one adhesive layer, wherein each adhesive layer includes an adhesive provided on at least one surface of the metal foil,
   wherein the adhesive comprises a conductive particle and an insulating adhesive composition,
   wherein a content of the conductive particle is 0.1 to 20% by volume to a whole adhesive volume,
   wherein the insulating adhesive composition further comprises a thermosetting resin, a curing agent for the thermosetting resin, and a film forming material,
   wherein the thermosetting resin is an epoxy resin,
   wherein a content of the thermosetting resin is 10 to 80% by mass to a total amount of the insulating adhesive composition,
   wherein a content of the curing agent is 2 to 10% by mass to the total amount of the insulating adhesive composition,
   wherein the film forming material is a phenoxy resin,
   wherein a weight-average molecular weight of the phenoxy resin is 10000 to 10000000, and
   wherein a content of the film forming material is approximately 67% to 80% by mass to the total amount of the insulating adhesive composition, wherein approximately is within the margins of error that are inherent in measuring the mass.

10. The method according to claim 9, wherein the conductive particle has an average particle size of 2 to 20 μm.

11. The method according to claim 9, wherein the conductive particle has a chestnut shape or a spherical shape.

12. The method according to claim 9, wherein the metal foil is a copper foil or an aluminum foil.

13. The method according to claim 9, wherein the adhesive layers are provided on both surfaces of the metal foil.

* * * * *